United States Patent
Miller et al.

(10) Patent No.: US 12,331,888 B2
(45) Date of Patent: Jun. 17, 2025

(54) PROCESS FOR COLD ENERGY UTILIZATION FROM A LIQUID CARBON DIOXIDE RECEIVING FACILITY

(71) Applicant: Kraken Technology Holdings, LLC, Houston, TX (US)

(72) Inventors: Christopher Michael Miller, Richmond, TX (US); Samantha Nicole Bryant, Houston, TX (US); Byron Gladus Best, III, Katy, TX (US); Bengt Arne Jarlsjo, Houston, TX (US); Daniel Joseph Shapiro, Houston, TX (US)

(73) Assignee: Kraken Technology Holdings, LLC, Houston, TX (US)

( * ) Notice: Subject to any disclaimer, the term of this patent is extended or adjusted under 35 U.S.C. 154(b) by 0 days.

(21) Appl. No.: 18/429,160

(22) Filed: Jan. 31, 2024

(65) Prior Publication Data

US 2024/0255193 A1    Aug. 1, 2024

Related U.S. Application Data

(60) Provisional application No. 63/482,691, filed on Feb. 1, 2023.

(51) Int. Cl.
    *A01G 9/18*      (2006.01)
    *C01B 32/50*     (2017.01)
    (Continued)

(52) U.S. Cl.
    CPC ............... *F17C 5/02* (2013.01); *A01G 9/18* (2013.01); *C01B 32/50* (2017.08); *F01D 25/12* (2013.01);
    (Continued)

(58) Field of Classification Search
    CPC ......... F25B 19/005; A01G 9/18; F01D 25/12; H05K 7/20327; H05K 7/20372; F05D 2220/31; Y02C 20/40
    See application file for complete search history.

(56) References Cited

U.S. PATENT DOCUMENTS 8,931,287 B2 *    1/2015    Aspelund ................. F17C 9/00
                                                        62/50.2
2010/0251763 A1    10/2010   Audun
(Continued)

FOREIGN PATENT DOCUMENTS

WO    WO-2008097099 A1 *   8/2008  ............... F17C 5/02
WO        2017083778 A1      5/2017

OTHER PUBLICATIONS

International Search Report and Written Opinion of the International Searching Authority for International Patent Application No. PCT/US2024/013927, mailed May 27, 2024, European Patent Office.
(Continued)

*Primary Examiner* — Frantz F Jules
*Assistant Examiner* — Martha Tadesse
(74) *Attorney, Agent, or Firm* — Spencer Fane, LLP

(57) ABSTRACT

A method for providing cold energy to one or more industrial or commercial facilities from a liquid carbon dioxide receiving facility is provided. The method includes the steps of unloading liquid carbon dioxide to the receiving facility, storing liquid carbon dioxide in temporary storage, generating boil-off gas from the temporary storage due to heat ingress, pumping and heating liquid carbon dioxide for external use or permanent geologic storage, and utilizing at least some, and preferably substantially all, of the cold energy from the liquid carbon dioxide for cooling one or more processes in the one or more industrial or commercial facilities.

18 Claims, 2 Drawing Sheets

(51) Int. Cl.
*F01D 25/12* (2006.01)
*F02C 7/14* (2006.01)
*F17C 5/02* (2006.01)
*F25B 19/00* (2006.01)
*H05K 7/20* (2006.01)
*A01G 33/00* (2006.01)
*F24F 5/00* (2006.01)

(52) U.S. Cl.
CPC .............. *F02C 7/14* (2013.01); *F25B 19/005* (2013.01); *H05K 7/20327* (2013.01); *H05K 7/20372* (2013.01); *A01G 33/00* (2013.01); *F05D 2220/31* (2013.01); *F05D 2220/32* (2013.01); *F05D 2260/213* (2013.01); *F17C 2221/013* (2013.01); *F17C 2223/0153* (2013.01); *F17C 2227/0135* (2013.01); *F17C 2227/0302* (2013.01); *F17C 2265/036* (2013.01); *F17C 2270/05* (2013.01); *F24F 2005/0039* (2013.01)

(56) References Cited

U.S. PATENT DOCUMENTS

| | | | | |
|---|---|---|---|---|
| 2011/0260112 | A1* | 10/2011 | Wijmans | F23J 15/006 |
| | | | | 252/372 |
| 2013/0081789 | A1 | 4/2013 | Pathier et al. | |
| 2017/0296961 | A1 | 10/2017 | Beaumont et al. | |
| 2020/0240588 | A1* | 7/2020 | Al Khowaiter | C01B 3/34 |
| 2021/0221351 | A1* | 7/2021 | Novek | F03B 13/06 |

OTHER PUBLICATIONS

"Putting CO2 to Use—Creating value from emissions", International Energy Agency, Sep. 2019, 86 pages.

A. King, Waste CO2 to be turned into ingredients for fuel, plastics and even food', Horizon The EU Research & Innovation Magazine, https://projects.research-and-innovation.ec.europa.eu/en/horizon-magazine/waste-co2-be-turned-ingredients-fuel-plastics-and-even-food, [retrieved from the Internet on Jul. 24, 2024], Nov. 19, 2018, 8 pages.

Dr. E. Adlen, Prof. C. Hepburn, "Guest post: Ten ways to use CO2 and how they compare", https://www.carbonbrief.org/guest-post-10-ways-to-use-co2-and-how-they-compare/, [retrieved from the Internet on Jul. 24, 2024],12 pages.

"Using Waste Heat for External Processes", Industrial Technologies Program, Jan. 2006, 2 pages, U.S Department of Energy.

"Waste Heat Recovery:Technology and Opportunities in U.S. Industry Prepared", BCS, Incorporated, Mar. 2008, 112 pages.

S. Bruckner, S. Liu, L. Miro, M. Radspieler, L.F. Cabeza, E. Lavemann, 'Industrial waste heat recovery technologies: An economic analysis of heat transformation technologies', Elsevier, (2015), pp. 157-167, Applied Energy.

'How Industrial Exhaust Heat Could Be Used To Extract Carbon Dioxide', (2023), 1 page, Kanazawa University.

J. Miles, 'Direct Air Capture Recovery of Energy for CCUS Partnership', U.S. Department of Energy National Energy Technology Laboratory, Aug. 29, 2023, 19 pages.

M. Loughrey, 'State of the Art: CCS Technologies 2023', Global CCS Institute, Jul. 2023, 123 pages.

P. Pei, K. Barse, A.J. Gil, J. Nasah, 'Waste heat recovery in CO2 compression', Science Direct, Nov. 2014, vol. 30, pp. 86-96, International Journal of Greenhouse Gas Control.

R. Zarzycki, 'The use of heat from the CO2 compression system for production of system heat', (2018), vol. 49, 10 pages, E3S Web of Conferences.

'Technology Data for Carbon Capture, Transport and Storage', Nov. 2021, 198 pages, Danish Energy Agency.

\* cited by examiner

PROCESS FOR COLD ENERGY UTILIZATION FROM A LIQUID CARBON DIOXIDE RECEIVING FACILITY

CROSS-REFERENCE TO RELATED APPLICATION

This application claims the benefit of U.S. Prov. App. No. 63/482,691 (filed Feb. 1, 2023), which is incorporated by reference herein in its entirety.

BACKGROUND

The present invention relates to a method and a process for the beneficial use of cold energy and/or carbon dioxide from a liquid carbon dioxide ($LCO_2$) receiving facility. The present invention also relates to a method and a process for integrating waste heat from one or more industrial or commercial facilities into a liquid carbon dioxide receiving facility.

As the global economy drives towards environmental, social, and governance (ESG) solutions for industrial and commercial facilities, cold energy utilization or waste heat recovery will be incorporated into industrial processes to achieve climate initiative goals. ESG targets will also drive industrial facilities to capture its carbon dioxide, which can be repurposed for beneficial use or permanently sequestered.

To support climate initiative goals, numerous industrial and commercial companies have committed to reducing their greenhouse gas emissions by using readily available carbon capture technologies and permanently storing the captured carbon dioxide ($CO_2$) in geological formations (sequestration). However, geological formations with adequate pore space for permanent carbon storage may not be located near the industrial and/or commercial facility utilizing carbon capture. Industrial and commercial companies are actively adapting processes to capture and liquefy the carbon dioxide for long distance transportation via trucks, railcars, barges, and/or ocean-going ships to reach remote carbon sinks.

There are multiple viable solutions to capture and liquefy carbon dioxide for long distance transportation. The carbon dioxide is captured, typically using either a cryogenic or a solvent-based solution. Capture facilities can be added to an industrial and/or commercial facility to reduce greenhouse gas emissions. A cryogenic capture solution produces a liquified carbon dioxide product whereas a solvent-based capture solution produces a carbon dioxide product that requires drying and liquefaction prior to long distance transportation. The liquid carbon dioxide is shipped via trucks, railcars, barges, and/or ocean-going ships from the industrial and/or commercial facility to a liquid carbon dioxide receiving facility for intermediate storage prior to external use or permanent geologic storage.

The liquid carbon dioxide arrives at the receiving facility as a saturated or subcooled fluid. Thermal energy is required to heat the liquid carbon dioxide prior to permanent geologic storage.

The present invention is directed to supporting climate initiative goals at the receiving facility. The cold energy contained within the liquid carbon dioxide can be harnessed and repurposed for additional beneficial purposes by integrating with other industrial processes. The cold energy in the liquid carbon dioxide can be used beneficially as a source of cooling, chilling, and/or refrigeration for industrial and commercial processes, including data centers, power generation facilities, cold storage facilities, district utilities, or commercial buildings.

To further support ESG solutions and climate initiatives, waste heat from nearby industrial and/or commercial facilities could also be integrated into the liquid carbon dioxide receiving facility to provide the required thermal energy. Sources of waste heat may be provided by power generation facilities, petroleum refineries, chemical production and manufacturing facilities, cement production facilities, or district utilities.

In addition to integrating the cold energy from the liquid carbon dioxide and waste heat from nearby industrial and/or commercial facilities, carbon dioxide from the liquid carbon dioxide receiving facility can also be used for beneficial purposes.

Heat ingress, from the surrounding environment, will cause the liquid carbon dioxide in the receiving facility to boil and generate boil-off gas (BOG). Boil-off gas can be compressed and re-liquified in a very energy intensive process. As an alternative solution, boil-off gas, and other sources of carbon dioxide from the receiving facility, can be heated against a source of waste heat, as outlined above, and used beneficially in greenhouses or for aquacultural purposes.

Carbon dioxide can be used beneficially to supplement or enrich the $CO_2$ concentration of the air inside greenhouses. $CO_2$-enriched greenhouses provide numerous benefits including improved yields, earlier flowering, increased number and size of flowers, increased stem/leaf size and thickness, and reduced number of days to maturation. The saturation point for most plants is reached at concentrations of 1,000-1,200 ppm of $CO_2$, whereas the saturation point for most seedlings is reached at concentrations of 800-1,000 ppm of $CO_2$. For comparison purposes, the atmospheric $CO_2$ concentration is approximately 420 ppm. By supplementing the greenhouse air with captured $CO_2$, greenhouses can produce a higher quality and larger quantity of fruits, vegetables, and/or flowers as compared to greenhouses without supplemental $CO_2$.

Carbon dioxide can also be used beneficially for aquacultural purposes, such as in algae farms, to enrich the $CO_2$ concentration of sparging air. Depending on the type of algae and/or microalgae, enhanced growth occurs at concentrations of 0.5-2 vol % $CO_2$. By enriching the sparging air, algae can be produced in larger quantities for use in fertilizers, animal food, food supplements, and/or biofuels. According to the present invention, carbon dioxide can be captured and either utilized in beneficial applications or sequestered in geological formations.

SUMMARY OF THE INVENTION

A method for providing cold energy to one or more industrial or commercial facilities from a liquid carbon dioxide receiving facility is provided. The method includes the steps of unloading liquid carbon dioxide to the receiving facility, storing liquid carbon dioxide in temporary storage, generating boil-off gas from the temporary storage due to heat ingress, pumping and heating liquid carbon dioxide for external use or permanent geologic storage, and utilizing at least some, and preferably substantially all, of the cold energy from the liquid carbon dioxide for cooling one or more processes in the one or more industrial or commercial facilities. The cold energy may be utilized from liquid or dense phase carbon dioxide that is heated prior to external use or permanent geologic storage, from liquid carbon dioxide that is vaporized for pressure control of the receiving facility, from vapor carbon dioxide that is heated to reduce or eliminate the formation of a two-phase fluid in the vapor return from the receiving facility to the transport vessels, and/or from vapor carbon dioxide that is heated prior to external use, and may be indirectly transferred to the one or more industrial or commercial facilities through an intermediate process.

A method for integrating waste heat from one or more industrial or commercial facilities into a liquid carbon dioxide receiving facility is also provided. The method includes the steps of unloading liquid carbon dioxide to the receiving facility, storing liquid carbon dioxide in temporary storage, generating boil-off gas from the temporary storage due to heat ingress, pumping and heating liquid carbon dioxide for external use or permanent geologic storage, and utilizing waste heat from the one or more industrial or commercial facilities to provide at least some, and preferably substantially all, of the required thermal energy for the receiving facility. The waste heat may be utilized to heat liquid or dense phase carbon dioxide prior to external use or permanent geologic storage, to vaporize liquid carbon dioxide for pressure control of the receiving facility, to heat vapor carbon dioxide to reduce or eliminate the formation of a two-phase fluid in the vapor return from the receiving facility to the transport vessels, and/or to heat vapor carbon dioxide prior to external use, and may be indirectly transferred to the receiving facility through an intermediate process.

DESCRIPTION OF FIGURES

The features and advantages of the present invention will be more clearly understood from the following description taken in conjunction with the accompanying drawings in which.

DETAILED DESCRIPTION OF THE INVENTION

The present invention relates to a method and process for the beneficial uses of cold energy and/or carbon dioxide from a liquid carbon dioxide receiving facility. The present invention also relates to a method and a process for integrating waste heat from one or more industrial or commercial facilities into a liquid carbon dioxide receiving facility.

In all embodiments described herein, carbon dioxide is captured and liquefied at an industrial source and then is transported to the $LCO_2$ receiving facility for intermediate storage prior to external use or permanent geologic storage (sequestration).

In all embodiments described herein, the terms "receiving facility", "$LCO_2$ receiving facility", "receiving terminal", and "$LCO_2$ receiving terminal" are used interchangeably and describe any inland, waterfront, or offshore facility used for the purposes of receiving, storing, processing, handling, and transportation of liquid carbon dioxide.

Furthermore, in all embodiments described herein, the liquid carbon dioxide is transported to the receiving facility via a liquid carbon dioxide transport vessel that includes, but is not limited to, trucks, railcars, barges and/or ocean-going ships.

In all embodiments described herein, the liquid carbon dioxide transport vessels operate at low, medium, and/or elevated pressure at saturation and/or subcooled temperatures.

Figure 1:
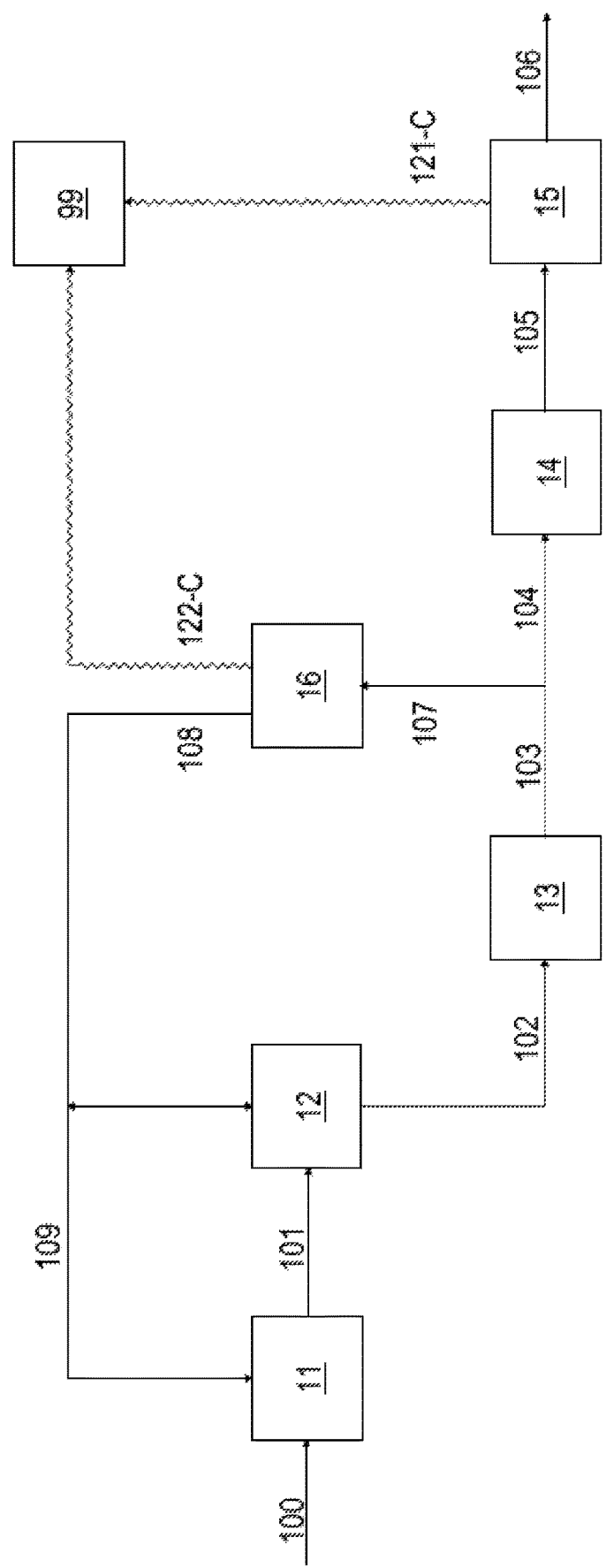
FIG. 1 depicts a process flow diagram in which cold energy from a liquefied carbon dioxide receiving facility is used as a source of cooling for an industrial or commercial facility.

With reference to FIG. 1, a first embodiment of the present invention is depicted, in which cold energy from a liquefied carbon dioxide receiving facility is used as a source of cooling for an industrial or commercial facility.

Liquid carbon dioxide is transported to the receiving facility via transport vessels that arrive at either low, medium, or elevated pressure. Liquid carbon dioxide 100 is unloaded from the transport vessel at Unloading 11.

At Unloading 11, the transport vessel is connected to an unloading manifold by an unloading arm and/or hose. Depending on the equipment associated with the transport vessel, the $LCO_2$ is either pumped or pressurized from the transport vessel to the unloading manifold in Unloading 11. Depending on the configuration of the $LCO_2$ receiving facility, liquid carbon dioxide 101 from the unloading manifold can be pumped to overcome the pressure losses related to unloading, custody metering, and frictional pressure drop in the transfer piping between Unloading 11 and Storage 12.

Storage 12 provides temporary storage, or buffer, for the receiving facility to accommodate the batch unloading of the transport vessels based on the timing of vessel arrivals at the receiving facility. The temporary storage allows for transport vessels to be unloaded at a rate greater than or equal to the capacity of the downstream receiving facility equipment and/or sequestration facilities.

Liquid carbon dioxide 101 arrives at Storage 12 at an operating pressure slightly greater than the operating pressure of the transport vessel in which it arrived. By operating Storage 12 at a slightly elevated pressure, the carbon dioxide will remain a liquid rather than flash to a vapor.

Liquid carbon dioxide 102 from Storage 12 is then sent to Booster Pump 13 where liquid carbon dioxide 103 is pumped to an intermediate operating pressure. A stream of liquid carbon dioxide 107 is sent to Vaporizer 16 while the remaining liquid carbon dioxide 104 is sent to Product Pump 14.

Product Pump 14 increases the pressure of dense phase carbon dioxide 105 to the pipeline operating pressure. Depending on the length of the downstream pipeline and/or operating pressure of the permanent geologic storage, Product Pump 14 could be configured to achieve the geologic storage injection pressure without additional pumping and/or compression.

From Product Pump 14, dense phase carbon dioxide 105 is sent to Export Heater 15 where export carbon dioxide 106 is heated to the pipeline operating temperature. The pipeline may be operated at a higher temperature than the received liquid carbon dioxide for reasons including, but not limited to, avoidance of hydrate formation and avoidance of phase dropout in the pipeline system. Export carbon dioxide 106 will be sent to the pipeline as either a dense phase fluid (e.g., a fluid that operates above the critical pressure but below the critical temperature) or supercritical fluid (e.g., a fluid that operates above the critical pressure and above the critical temperature).

Vaporizer 16 heats liquid carbon dioxide 107 to generate vapor carbon dioxide 108 that is used to control the pressure of Storage 12. The liquid level in Storage 12 fluctuates based on the batch unloading of the liquid carbon dioxide transport vessels. When the transport vessels are not being unloaded, Booster Pump 13 will continue to draw down the liquid level of Storage 12, thus creating additional vapor space and reducing the operating pressure of Storage 12. To maintain a constant operating pressure in Storage 12, vapor carbon dioxide 108 is added to Storage 12 from Vaporizer 16.

The liquid level of Storage 12 will increase when liquid carbon dioxide 101 is unloaded from the transport vessel as the batch unloading rate will be greater than the continuous draw down rate from Booster Pump 13. As the liquid level increases, the vapor in Storage 12 will be displaced to maintain a constant operating pressure. As such, when unloading transport vessels, Vaporizer 16 will be idle since vapor generation will not be required to maintain a constant pressure in Storage 12.

Displaced vapor 109 from Storage 12 is routed back to the transport vessel to balance the volume displaced by unloading $LCO_2$. Displaced vapor 109 is sent to a vapor return manifold at Unloading 11, which is connected to the transport vessel by a loading arm and/or hose. The operating pressure of Storage 12 will be slightly greater than the operating pressure of the transport vessel to overcome pressure losses related to loading, custody metering, and/or frictional pressure drop in the transfer piping between Storage 12 and Unloading 11.

During normal operations, the receiving terminal generates boil-off gas as heat is transferred from ambient air to the liquefied carbon dioxide in Storage 12. The BOG will accumulate and will reduce and/or eliminate the amount of vapor required from Vaporizer 16 to maintain a constant operating pressure in Storage 12. As BOG generation increases, and the pressure of Storage 12 continues to rise, the vapor in Storage 12 will need to be vented to atmosphere to maintain constant operating pressure (not shown in FIG. 1).

Although not shown, the boil-off gas can be used external to the process. In certain aspects of the present invention, the BOG, which consists of mostly carbon dioxide, can be used to supplement or enrich the $CO_2$ concentration of air inside a greenhouse or can also be used to enrich the air used to cultivate algae, as described in co-owned U.S. patent application Ser. No. 18/451,508 (filed Aug. 17, 2023), Ser. No. 18/472,809 (filed Sep. 22, 2023), and Ser. No. 18/472,914 (filed Sep. 22, 2023), each of which is incorporated herein in its entirety.

In all embodiments described herein, industrial/commercial facility 99 includes, but is not limited to data centers, power generation, district utilities, cold storage facilities, or a combination thereof.

Industrial/commercial facility 99 can be cooled from sources of cold energy located within the $LCO_2$ receiving facility. Cold energy 121-C from Export Heater 15 and 122-C from Vaporizer 16 can be converted to cold thermal energy used for cooling or chilling process within industrial/commercial facility 99.

Dense phase carbon dioxide 105 is heated by Export Heater 15. Cold energy 121-C contained in dense phase carbon dioxide 105 could be transferred directly to industrial/commercial facility 99 to provide a source of cooling and/or chilling. The waste heat from industrial/commercial facility 99 will be simultaneously transferred to the carbon dioxide to reach the desired pipeline operating temperature.

Liquid carbon dioxide 107 is heated by Vaporizer 16. Cold energy 122-C contained in liquid carbon dioxide 107 could be transferred directly to an industrial/commercial facility 99 to provide a source of cooling and/or chilling. The waste heat from industrial/commercial facility 99 will be used to vaporize liquid carbon dioxide 107 to control the operating pressure of Storage 12.

Where industrial/commercial facility 99 consists of a data center, the cold energy from the receiving facility can be utilized to provide a source of cooling or chilling for the servers, computer room air handling units, and/or the heating, ventilation, and air conditioning (HVAC) systems of the data centers.

In all embodiments described herein, where industrial/commercial facility 99 consists of a power generation facility, the cold energy from the receiving facility can be utilized to provide a source of cooling or chilling for the steam condensers or a source of cooling or chilling for the gas turbine air intake.

Where industrial/commercial facility 99 consists of district utility systems, the cold energy from the receiving facility can be utilized to provide a source of cooling or chilling for district cooling.

Furthermore, industrial/commercial facility 99 could comprise any industrial or commercial process in which cold energy from the receiving facility could be used to replace or supplement a cooling or chilling system, (e.g., circulating or closed-loop cooling water system and/or refrigeration system).

Industrial/commercial facility 99 could also comprise any industrial or commercial process in which cold energy from the receiving facility could be used to replace or supplement a refrigeration system, including cold storage (e.g., food storage).

Furthermore, the cold energy from the receiving facility may be transferred indirectly to industrial/commercial facility 99 through an intermediate cooling system (e.g., glycol cooling system) instead of being directly transferred to industrial/commercial facility 99.

Although not shown, waste heat from an industrial or commercial application external to the process may be integrated into the receiving facility to provide a source of thermal energy for heating and/or vaporizing the carbon dioxide as described above.

Figure 2:
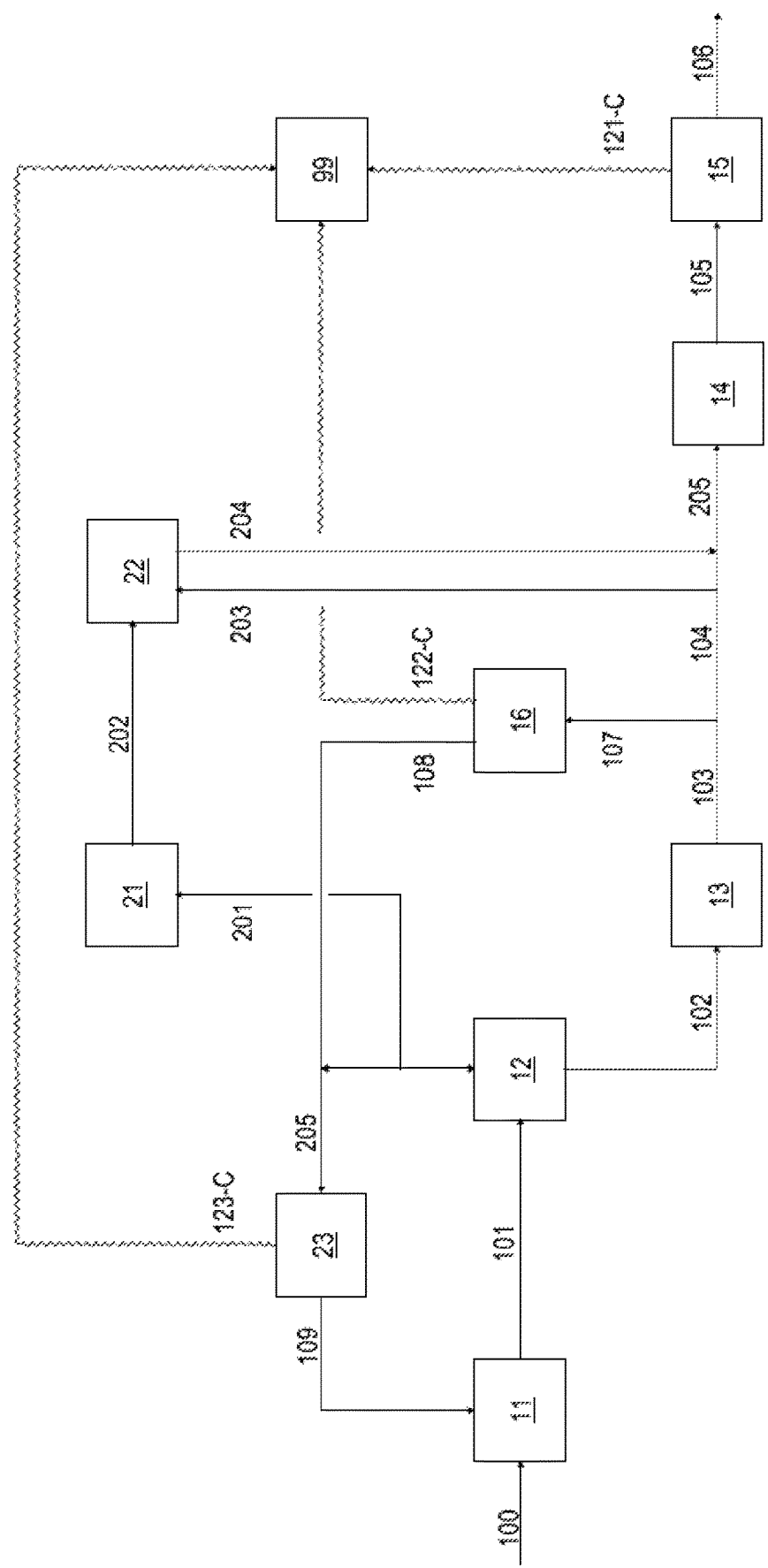
FIG. 2 depicts a process flow diagram in which cold energy from a liquefied carbon dioxide receiving facility with boil-off gas recondensing is used as a source of cooling for an industrial or commercial facility.

In a second embodiment of the present invention, FIG. 2 depicts a receiving facility with boil-off gas (BOG) recondensing, in which cold energy is used as a source of cooling for an industrial or commercial application (as described above with respect to FIG. 1).

Similar to FIG. 1, liquid carbon dioxide arrives at the receiving facility and is unloaded from the transport vessels for temporary storage in Storage 12. Instead of venting excess boil-off gas, FIG. 2 illustrates a method of recovering and recondensing the boil-off gas to maintain a constant operating pressure in Storage 12.

Boil-off gas 201 from Storage 12 is sent to BOG Compressor 21 where boil-off gas 202 is compressed and sent Recondenser 22.

Although not shown, the boil-off gas can be used external to the process to supplement or enrich the $CO_2$ concentration of air inside a greenhouse or can be used to enrich the air used to cultivate algae.

A stream of liquid carbon dioxide 203, from the discharge of Booster Pump 13, is sent to Recondenser 22 as a subcooled liquid. The subcooled carbon dioxide is sprayed in the top of Recondenser 22 and condenses boil-off gas 202 as it rises across the packed bed in Recondenser 22. Condensed boil-off gas 204 is then sent to Product Pump 14 to increase the pressure prior to export to the pipeline.

Depending on the physical configuration of the receiving facility and/or the operating pressure of the transport vessels, displaced vapor 205 may condense if there are significant pressure losses between Storage 12 and the transport vessel (e.g., loading, custody metering, and/or frictional pressure drop in the transfer piping). To avoid the formation of a two-phase fluid in the transport vessel vapor return, heat is added to displaced vapor 205 via Vapor Heater 23.

Displaced vapor 205 is heated by Vapor Heater 23. Cold energy 123-C contained in displaced vapor 205 could be transferred directly to an industrial/commercial facility 99 to provide a source of cooling and/or chilling. The waste heat from industrial/commercial facility 99 will be used to heat displaced vapor 205 to minimize the formation of a two-phase fluid.

In yet another embodiment of the present invention, a method for providing cold energy to one or more industrial or commercial facilities from a liquid carbon dioxide receiving facility is provided. The method includes the steps of unloading liquid carbon dioxide to the receiving facility, storing liquid carbon dioxide in temporary storage, generating boil-off gas from the temporary storage due to heat ingress, pumping and heating liquid carbon dioxide for external use or permanent geologic storage, and utilizing at least some, and preferably substantially all, of the cold energy from the liquid carbon dioxide for cooling one or more processes in the one or more industrial or commercial facilities. The cold energy may be utilized from liquid or dense phase carbon dioxide that is heated prior to external use or permanent geologic storage, from liquid carbon dioxide that is vaporized for pressure control of the receiving facility, from vapor carbon dioxide that is heated to reduce or eliminate the formation of a two-phase fluid in the vapor return from the receiving facility to the transport vessels, and/or from vapor carbon dioxide that is heated prior to external use, and may be indirectly transferred to the one or more industrial or commercial facilities through an intermediate process. The liquid carbon dioxide is transported to the receiving facility using transport vessels selected from one or more of trucks, railcars, barges, ocean-going ships, or a combination thereof. The industrial or commercial facilities may include one or more data centers, wherein the cold energy is used to provide cooling for the servers, computer room air handling unit, the heating, ventilation, air conditioning systems (HVAC), or a combination thereof. The industrial or commercial facilities may also include one or more power generation facilities, wherein the cold energy is used to provide cooling for the steam condensers, gas turbine air intake, or a combination thereof. The industrial or commercial facilities may also include district cooling, wherein the cold energy is used to provide cooling for the chilled water system. The industrial or commercial facilities may also include district heating, wherein the cold energy is used to provide cooling for the power or heat generating facility. The industrial or commercial facilities may also include cold storage, wherein the cold energy is used to provide cooling for a refrigeration system. The liquid carbon dioxide is in liquid phase, dense phase, or supercritical phase after the pumping and heating step. The carbon dioxide, which includes boil-off gas, may also be used beneficially in one or more industrial or commercial applications external to the process, such as one or more greenhouses, wherein the carbon dioxide is used to supplement the $CO_2$ concentration of the air inside the one or more greenhouses. The one or more industrial or commercial applications external to the process may also include one or more algae farms, wherein the carbon dioxide is used to enrich the $CO_2$ concentration of the sparging air in the one or more algae farms.

In yet another embodiment of the present invention, a method for integrating waste heat from one or more industrial or commercial facilities into a liquid carbon dioxide receiving facility is provided. The method includes the steps of unloading liquid carbon dioxide to the receiving facility, storing liquid carbon dioxide in temporary storage, generating boil-off gas from the temporary storage due to heat ingress, pumping and heating liquid carbon dioxide for external use or permanent geologic storage, and utilizing waste heat from the one or more industrial or commercial facilities to provide at least some, and preferably substantially all, of the required thermal energy for the receiving facility. The waste heat may be utilized to heat liquid or dense phase carbon dioxide prior to external use or permanent geologic storage, to vaporize liquid carbon dioxide for pressure control of the receiving facility, to heat vapor carbon dioxide to reduce or eliminate the formation of a two-phase fluid in the vapor return from the receiving facility to the transport vessels, and/or to heat vapor carbon dioxide prior to external use, and may be indirectly transferred to the receiving facility through an intermediate process. The one or more industrial or commercial facilities is selected from power generation, district heating, petroleum refining, chemical production, cement production, carbon capture processes, or a combination thereof. The liquid carbon dioxide is in liquid phase, dense phase, or supercritical phase after the pumping and heating step. The carbon dioxide, which includes boil-off gas, may also be used beneficially in one or more applications external to the process, such as one or more greenhouses, wherein the carbon dioxide is used to supplement the $CO_2$ concentration of the air inside the one or more greenhouses. The one or more applications external to the process may also include one or more algae farms, wherein the carbon dioxide is used to enrich the $CO_2$ concentration of the sparging air in the one or more algae farms.

Therefore, the present invention is well adapted to attain the ends and advantages mentioned as well as those that are inherent therein. The particular embodiments disclosed above are illustrative only, as the present invention may be modified and practiced in different but equivalent manners apparent to those skilled in the art having the benefit of the teachings therein. It is therefore evident that the particular embodiments disclosed above may be altered or modified and all such variations are considered within the scope and spirit of the present invention.

What is claimed is:

1. A method for providing cold energy to one or more industrial or commercial facilities from a liquid carbon dioxide receiving facility, comprising:
   unloading liquid carbon dioxide from a transport vessel to the liquid carbon dioxide receiving facility;
   storing the liquid carbon dioxide in temporary storage;
   pumping and heating the liquid carbon dioxide from the temporary storage for external use or permanent geologic storage; and
   utilizing at least some of the cold energy from the liquid carbon dioxide to provide cooling, chilling, or refrigeration duty to one or more processes in the one or more industrial or commercial facilities.

2. The method of claim 1, further comprising utilizing substantially all of the cold energy to provide the cooling, chilling, or refrigeration duty to the one or more processes in the one or more industrial or commercial facilities.

3. The method of claim 1, wherein the cold energy is indirectly transferred to the one or more industrial or commercial facilities through an intermediate process.

4. The method of claim 1, wherein the cold energy is utilized from liquid or dense phase carbon dioxide that is heated prior to the external use or the permanent geologic storage.

5. The method of claim 1, wherein the cold energy is utilized from the liquid carbon dioxide that is vaporized for managing pressure of the receiving facility.

6. The method of claim 1, wherein the cold energy is utilized from vapor carbon dioxide that is heated to reduce or eliminate formation of a two-phase fluid in a vapor return line between the receiving facility and the transport vessels.

7. The method of claim 1, wherein the cold energy is utilized from vapor carbon dioxide that is heated prior to the external use.

8. The method of claim 1, wherein the liquid carbon dioxide is transported to the receiving facility using the transport vessel selected from one or more of trucks, railcars, barges, ocean-going ships, or a combination thereof.

9. The method of claim 1, wherein the one or more industrial or commercial facilities comprises one or more data centers, wherein the cold energy is used to provide the cooling, chilling, or refrigeration duty for servers, computer room air handling unit, a heating, ventilation, air conditioning systems (HVAC), or a combination thereof.

10. The method of claim 1, wherein the one or more industrial or commercial facilities comprises one or more power generation facilities, wherein the cold energy is used to provide the cooling, chilling, or refrigeration duty for a steam condensers, a gas turbine air intake, or a combination thereof.

11. The method of claim 1, wherein the one or more industrial or commercial facilities comprises district cooling, wherein the cold energy is used to provide the cooling, chilling, or refrigeration duty to a chilled water system.

12. The method of claim 1, wherein the one or more industrial or commercial facilities comprises district heating, wherein the cold energy is used to provide the cooling, chilling, or refrigeration duty for a power or heat generating facility.

13. The method of claim 1, wherein the industrial or commercial facilities comprises cold storage, wherein the cold energy is used to provide the cooling, chilling, or refrigeration duty for a refrigeration system.

14. The method of claim 1, wherein the liquid carbon dioxide is in liquid phase, dense phase, or supercritical phase after the pumping and heating step.

15. The method of claim 1, wherein the carbon dioxide is used in one or more industrial or commercial applications.

16. The method of claim 15, wherein the carbon dioxide comprises boil-off gas.

17. The method of claim 15, wherein the one or more industrial or commercial applications comprises one or more greenhouses, wherein the carbon dioxide is used to supplement a $CO_2$ concentration of an air inside the one or more greenhouses.

18. The method of claim 15, wherein the one or more industrial or commercial applications comprises one or more algae farms, wherein the carbon dioxide is used to enrich a $CO_2$ concentration of a sparging air in the one or more algae farms.

* * * * *